United States Patent
Noguchi

[11] Patent Number: 5,123,174
[45] Date of Patent: Jun. 23, 1992

[54] POSITIONING TABLE
[75] Inventor: Satoshi Noguchi, Kyoto, Japan
[73] Assignee: Nissha Printing Co., Ltd., Kyoto, Japan
[21] Appl. No.: 623,649
[22] PCT Filed: Apr. 26, 1990
[86] PCT No.: PCT/JP90/00543
    § 371 Date: Dec. 19, 1990
    § 102(e) Date: Dec. 19, 1990
[87] PCT Pub. No.: WO90/13790
    PCT Pub. Date: Nov. 15, 1990

[30] Foreign Application Priority Data
Apr. 28, 1989 [JP] Japan .................. 1-109925

[51] Int. Cl.[5] .......................................... B23Q 16/00
[52] U.S. Cl. ........................................ 33/568; 33/569;
    33/1 M; 269/73; 248/913
[58] Field of Search .................. 33/568, 569, 570, 573,
    33/1 M; 248/245, 913, 178; 269/71, 73, 61;
    108/140

[56] References Cited
U.S. PATENT DOCUMENTS

| | | | |
|---|---|---|---|
| 3,188,078 | 6/1965 | Peterson | 33/570 |
| 3,867,038 | 2/1975 | Westell | 356/395 |
| 3,950,095 | 4/1976 | Bouygues et al. | 33/568 |
| 4,005,651 | 2/1977 | Sigel et al. | 101/128.1 |
| 4,118,869 | 10/1978 | Hartung et al. | 33/568 |
| 4,193,317 | 3/1980 | Ono et al. | 108/20 |
| 4,575,942 | 3/1986 | Moriyama | 33/568 |
| 4,667,415 | 5/1987 | Barsky | 33/568 |
| 4,676,649 | 6/1987 | Phillips | 33/1 M |
| 4,731,934 | 3/1988 | Barnaby et al. | 33/504 |
| 4,784,377 | 11/1988 | Woodward | 269/71 |
| 4,887,804 | 12/1989 | Ohtsuka | 33/568 |
| 4,896,869 | 1/1990 | Takekoshi | 269/71 |
| 5,031,547 | 7/1991 | Hirose | 33/1 M |

FOREIGN PATENT DOCUMENTS

| | | | |
|---|---|---|---|
| 2728587 | 1/1979 | Fed. Rep. of Germany | 269/73 |
| 3735154 | 5/1988 | Fed. Rep. of Germany | 33/706 |
| 56-154607 | 11/1981 | Japan . | |
| 0074601 | 5/1982 | Japan | 33/573 |
| 62-272186 | 11/1987 | Japan . | |
| 63-35991 | 3/1988 | Japan . | |
| 63-155637 | 10/1988 | Japan . | |

Primary Examiner—Thomas B. Will
Attorney, Agent, or Firm—Wenderoth, Lind & Ponack

[57] ABSTRACT

A positioning table for locating a workpiece (17) at a predetermined position in a thin film forming apparatus. A base plate (2) movable in X-direction is supported below a workpiece placing table (12) for placing the workpiece thereon. A reference member supporting member (4) mounted on the base plate is respectively movable both in Y-direction and θ-direction about a predetermined shaft. First, second, and third reference members (5a, 5b, 5c) capable of contacting the workpiece by an urging device are supported by the reference member supporting member. When each reference member is moved in the X-direction or the Y-direction so as to locate the workpiece at the predetermined position, the three reference members move together with the reference member supporting member (4) in each direction. When the workpiece is moved in the θ-direction, the three reference members reliably rotate about the predetermined shaft and the rotational center of the workpiece is fixed.

3 Claims, 7 Drawing Sheets

POSITIONING TABLE

TECHNICAL FIELD

The present invention relates a compact and light positioning table for fixing a workpiece to a predetermined position in a functional film forming apparatus such as a thin film forming apparatus to be used for printing and forming, on the surface of a workpiece such as a glass substrate, various functional thin films such as a liquid crystal orienting film, a photoresist film, a liquid crystal sealing film or an insulating film of a semiconductor element.

BACKGROUND ART

Heretofore, positioning tables of various structures have been devised. For example, a three-layered table is known in which in order to fix a workpiece such as a glass substrate to a predetermined position by moving a workpiece lengthwise, widthwise, and a certain angle about a rotational shaft, there are provided vertically on a base table an X-direction table movable in X-direction, a Y-direction table movable in Y-direction, and $\theta$-direction table movable in $\theta$-direction. According to this positioning table, the base table is provided with a circular guide and a pulse motor or a servo motor so as to move the $\theta$-direction table in $\theta$-direction. The $\theta$-direction table is provided with a pulse motor or a servo motor through a linear guide and a ball thread so as to move the Y-direction table in Y-direction. The Y-direction table is provided with a pulse motor or a servo motor through a linear guide and a ball thread so as to move the X-direction table in X-direction. Each table is moved along the guide by driving the motor to adjust the positioning of the workpiece in each direction.

However, including the base table, the positioning table of the above construction is four-layered and as such, thick and heavy and in addition, the entire structure thereof is complicated because each table is provided with the guide and the motor except the X-direction table. Accordingly, when a thin film forming apparatus which incorporates the positioning table is used as a moving type table, the apparatus is large-sized. Therefore, the apparatus has an issue that in moving the table or placing the workpiece in position, a prompt operation cannot be carried out.

In order to solve the above issue, the following positioning table has been proposed. According to the positioning table, a driving device such as a pulse motor or a servo motor is provided on one table, three reference pins which are slidably moved by the driving device are arranged to be L-shaped, and a workpiece is pressed by a workpiece pressing device (pusher) to press the workpiece against the reference pins. The positioning of the workpiece in each direction is adjusted by moving each reference pin.

However, in the above construction, when the workpiece is moved in $\theta$-direction, the rotational center of the workpiece is not fixed. That is, when each reference pin is moved, the rotational axis of the workpiece is changed. Therefore, when the positioning of the workpiece is carried out based on data, the period of time for locating the workpiece at a predetermined position becomes long.

Accordingly, in order to solve the above-described issue, the object of the present invention is to provide a positioning table which is capable of accomplishing the positioning operation of a workpiece in a short period of time and compact, light, and simple in structure.

DISCLOSURE OF THE INVENTION

In order to achieve the above object, according to the present invention, three reference members to be used for locating a workpiece at a predetermined position are capable of rotating together about a predetermined shaft. That is, a positioning table comprises: a workpiece placing table for placing a workpiece; a base plate supported below the workpiece placing table so that the base plate is movable in an X-direction; a first driving device for moving the base plate in the X-direction; a first reference member, a second reference member, and a third reference member each capable of contacting the workpiece placed on said workpiece placing table; a reference member supporting member, mounted on the base plate so that the reference member supporting member is movable in Y-direction and $\theta$-direction about a predetermined shaft, for supporting the first reference member and the second reference member spaced a predetermined interval from each other and the third reference member, spaced a predetermined interval from the second reference member, in the direction perpendicular to the direction in which the first reference member and the second reference member are arranged; a second driving device for moving the reference member supporting member in the Y-direction; a third driving device for moving the reference member supporting member in the $\theta$-direction; an urging device for urging the workpiece so that the workpiece contacts the first reference member, the second reference member, and the third reference member; a mark detecting means for detecting position adjusting marks attached to the workpiece; a calculating means for calculating the dislocation amount between a result detected by the detecting means and a desired position at which the marks are to be positioned; and a control means for, based on a result calculated by the calculating means, controlling the movements of the first driving device, the second driving device, and the third driving device so as to place the marks at the desired position.

In the above construction, the second driving device and the third driving device can comprise a pair of driving mechanisms for moving the reference member supporting member in the Y-direction, and the reference member supporting member is moved in the Y-direction by making the movement amounts of both driving mechanisms equal to each other and can be rotated in the $\theta$-direction about the predetermined shaft by differentiating the movement amounts of both mechanisms from each other.

In the positioning table of the above construction, the movement of each of the reference members can be adjustable with respect to the reference member supporting member.

According to the positioning table of the above construction, the workpiece is placed on the workpiece placing table, then, urged by the urging device so that the workpiece contacts the three reference members. The detecting means detects the current positions of the marks attached to the workpiece. Based on this information, the calculating means calculates the dislocation amount between the desired position of the workpiece and the current position thereof. Based on the calculated result, the control means controls the movements of the first, second, and third driving devices. That is, for example, the first driving device is driven to move the base plate, which supports the reference member supporting member, in the X-direction so that the position of the workpiece is adjusted in the X-direction. The second driving device is driven to move the reference member supporting member in the Y-direction with respect to the base plate so that the position of the workpiece is adjusted in the Y-direction. The third driving device is driven to move the reference member supporting member in the $\theta$-direction with respect to the base plate so that the position of the workpiece is adjusted in the $\theta$-direction. When the reference member supporting member is moved (rotated) in the $\theta$-direction, the three reference members are rotated together about the predetermined shaft.

According to the above construction, the three reference members are supported by the reference member supporting member and movable together in the $\theta$-direction about the predetermined shaft. Therefore, when each reference member is moved in the X-direction or the Y-direction, the three reference members move in each direction together with the reference member supporting member. When the workpiece is moved in the $\theta$-direction, it reliably rotates about the predetermined shaft. Accordingly, the rotational center of the workpiece is fixed and as such, when the position of the workpiece is adjusted based on data, the period of time for locating the workpiece in position can be reduced. In addition, since the positioning table comprises two-layered construction of the workpiece placing table and the base plate, it is compact, light, and simple in construction.

BRIEF DESCRIPTION OF THE DRAWINGS

These and other objects and features of the present invention will become clear from the following description taken in conjunction with the preferred embodiments thereof with reference to the accompanying drawings, in which.

BEST MODE FOR CARRYING OUT THE INVENTION

Figure 1:
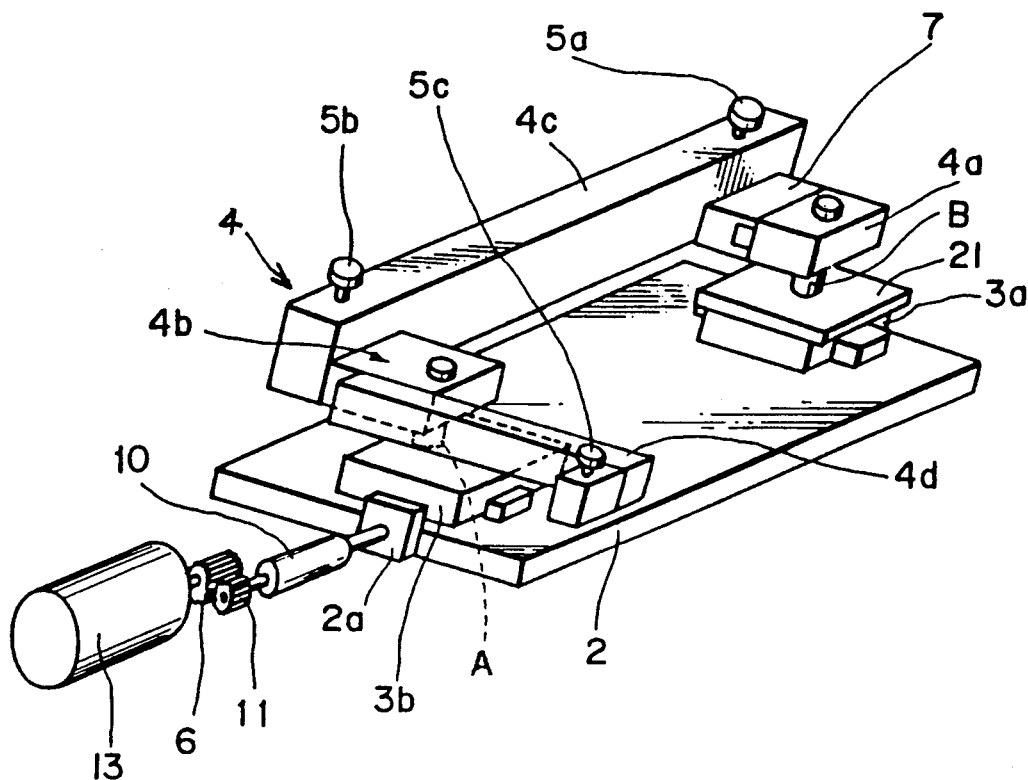
FIG. 1 is a schematic perspective view showing the principal portion of a positioning table according to an embodiment of the present invention.
Figure 4:
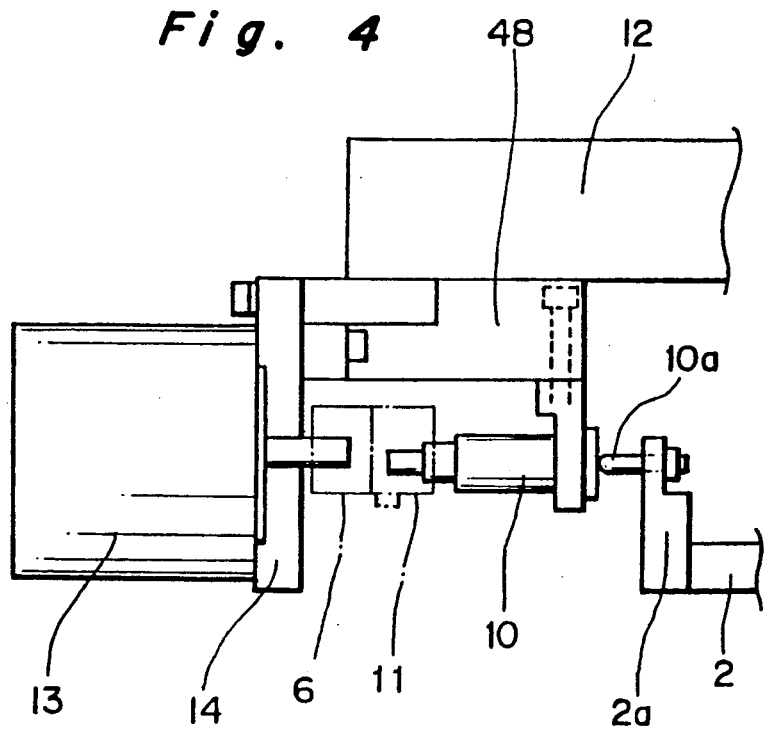
FIG. 4 is a side elevation showing a first driving device, for driving the base plate in X-direction, according to the above embodiment.

Before the description of the present invention proceeds, it is to be noted that like parts are designated by like reference numerals throughout the accompanying drawings.

An embodiment according to the present invention is described in detail based on FIG. 1 through FIG. 11.

Figure 2:
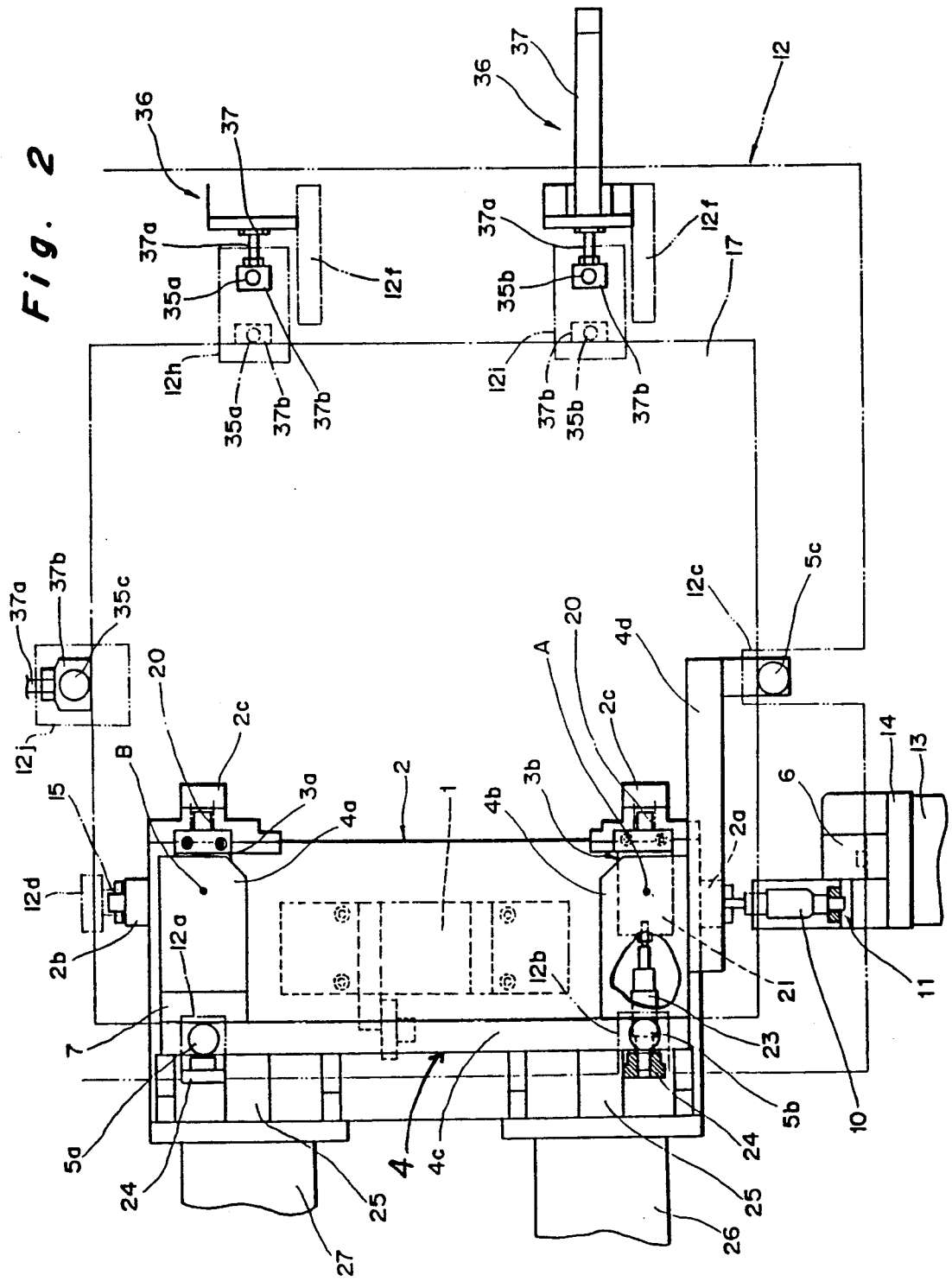
FIG. 2 is a plan view partly in section of the positioning table.

According to a positioning table of the present invention, as shown in FIGS. 1 and 2, a rectangular base plate 2 is positioned below a rectangular workpiece placing table 12 so that the base plate 2 is movable in X-direction; first, second, and third reference pins 5a, 5b, and 5c arranged in an L-shaped configuration and each serving as first, second, and third reference members are fixed to a reference member supporting member, namely, a reference pin supporting member 4; the reference pin supporting member 4 is mounted on the base plate 2 so that the reference pin supporting member 4 is respectively movable in Y-direction perpendicular to the X-direction and in $\theta$-direction about a predetermined rotational shaft A; a workpiece 17 is placed on the workpiece placing table 12; the workpiece 17 is urged by urging devices so that the workpiece 17 contacts the first, second, and third reference pins 5a, 5b, and 5c; marks 17a and 17b (see FIG. 11) attached to the workpiece 17 are then detected by a detecting device, and the dislocation amount between the current position of the workpiece 17 and the desired position thereof is calculated by a calculating means; and according to the control of a control means based on the calculated result, the movement of the base plate 2 in the X-direction is adjusted by a first driving device, the movement of the reference pin supporting member 4 in the Y-direction is adjusted by a second driving device, and the movement of the reference pin supporting member 4 in the $\theta$-direction is adjusted by a third driving device. Thus, the workpiece 17 is positioned at the desired position.

The workpiece placing table 12 is fixed to a thin film forming apparatus provided with the positioning table, and the workpiece 17 such as a glass plate is placed on the workpiece placing table 12. A pair of sides, of the workpiece placing table 12, opposed to each other are positioned in the X-direction and the remaining pair of sides thereof opposed to each other are positioned in the Y-direction. On one side in the X-direction, a first cut-away 12a and a second cut-away 12b are formed at positions each corresponding to the first and second reference pins 5a and 5b. On one side in the Y-direction, a third cut-away 12c is formed at a position corresponding to the third reference pin 5c. A large cut-away to connect the first cut-away 12a and the second cut-away 12b with each other can be formed on the workpiece placing table 12. The cut-aways are not necessarily formed on the workpiece placing table 12 if the reference pin 5 is capable of contacting the workpiece 17 as will be described later. Cut-aways are formed, on the workpiece placing table 12, at a position corresponding to each of the urging device. That is, on the side opposed to the first and second reference pins 5a and 5b, a fourth cut-away 12h and a fifth cut-away 12i are formed at positions each corresponding to a first pusher pin 35a and a second pusher pin 35b. On the side opposed to the third reference pin 5c, a sixth cut-away 12j is formed at a position corresponding to a third pusher pin 35c.

Figure 3:
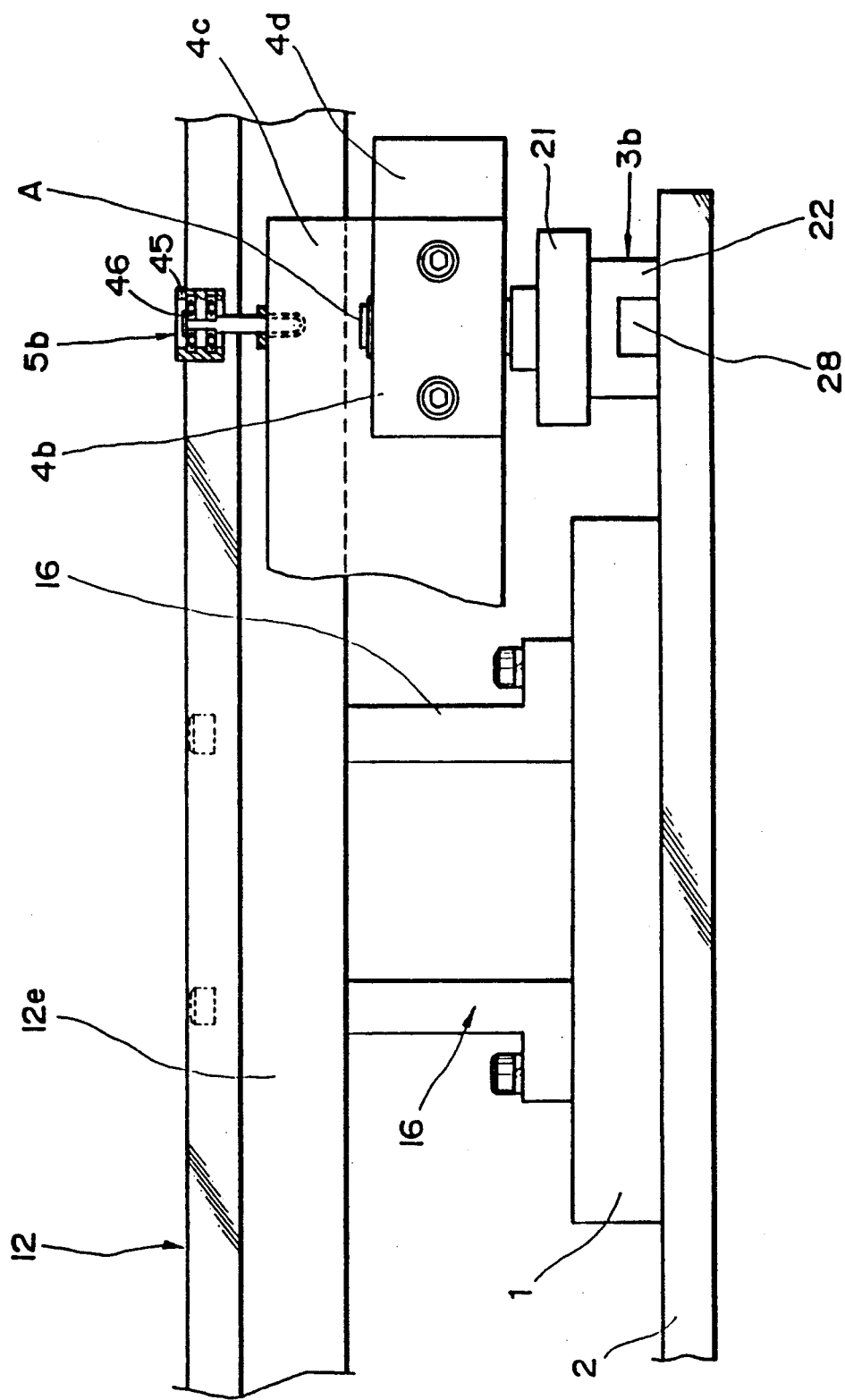
FIG. 3 is a side elevation showing the relationship between the workpiece placing table of the positioning table and the base plate thereof.
Figure 5:
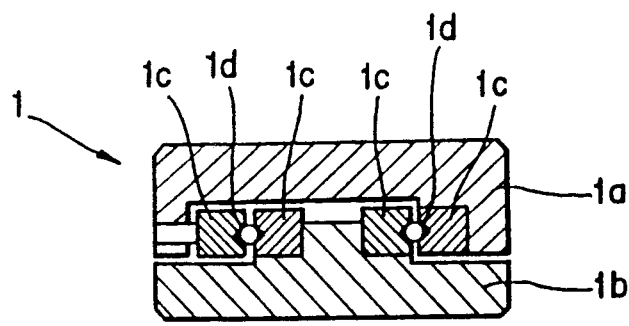
FIG. 5 is a sectional view showing a slide device according to the above embodiment.
Figure 7:
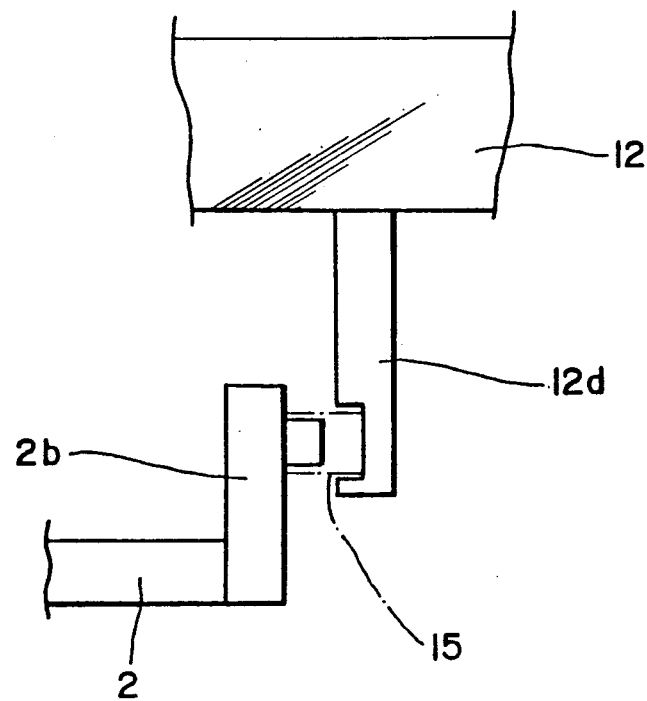
FIG. 7 is a side elevation showing the relationship between the base plate and the workpiece placing table according to the above embodiment.

As shown in FIG. 2, the base plate 2 is positioned below the workpiece placing table 12 in the left side of FIG. 2. A pair of the sides, of the base plate 2, opposed to each other is positioned in the X-direction while the remaining pair of the sides, of the base plate 2, opposed to each other is positioned in the Y-direction. As shown in FIG. 3, a slide guide 1 is hangingly supported by the workpiece placing table 12 through a pair of brackets 16 and 16 under the workpiece placing table 12, and the base plate 2 is hangingly supported by the slide guide 1 at the lower surface thereof so that the base plate 2 slidably moves in the X-direction. As shown in FIG. 5, the slide guide 1 is a known slide device comprising an upper portion 1a, a lower portion 1b, and two feeding portions arranged between the upper and lower portions 1a and 1b and each having a roller 1d rotatably sandwiched between a pair of guides 1c and 1c. The upper portion 1a is fixed to the brackets 16 and 16 while the lower portion 1b is fixed to the base plate 2. The first driving device for driving the base plate 2 in the X-direction is constructed as described below. That is, as shown in FIGS. 1, 2, 4, and 6, a driving motor (pulse motor) 13 is supported by the workpiece placing table 12 through a bracket 14 and a gear 11 engages a gear 6 fixed to the rotational shaft of the driving motor 13. The gear 11 is fixed to the rear end of the rotational shaft 10a of a micrometer head 10 supported by a bracket 48 in the X-direction, and the front end of the rotational shaft 10a is fixed to a locking end 2a which is one end of the base plate 2 extending in the X-direction. Accordingly, upon actuation of the driving motor 13, the rotational shaft 10a of the micrometer head 10 is moved forward or backward in the X-direction during its rotation through the gears 6 and 11 so as to move the base plate 2 in the X-direction. As shown in FIG. 7, on the other end of the base plate 2, a compression spring 15 is interposed in the X-direction between the locking end 2b of the base plate 2 and a locking portion 12d extending downward from the lower surface of the workpiece placing table 12 so that the base plate 2 is always pressed toward the driving motor 13 in the X-direction. Accordingly, the movement of the base plate 2 is adjusted within the compressive range of the compression spring 15.

The reference pin supporting member 4 comprises five members combined in an U-configuration and arranged on the upper surface of the base plate 2 so that they are movable in the Y-direction and rotatable in the $\theta$-direction about the rotational shaft A.

Figure 9:
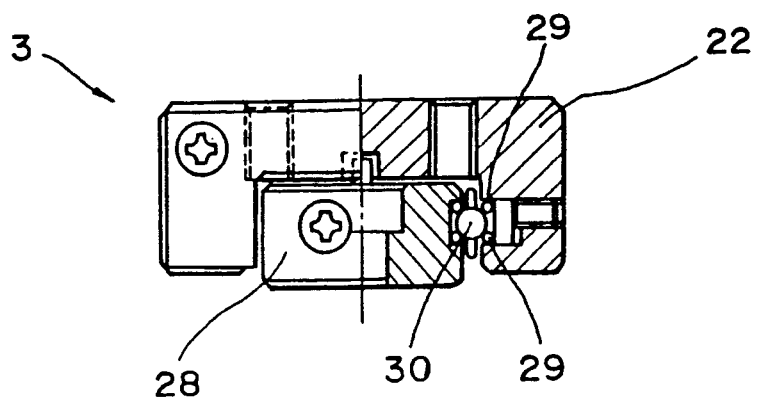
FIG. 9 is a sectional view partly in section of the slide device according to the above embodiment.
Figure 11:
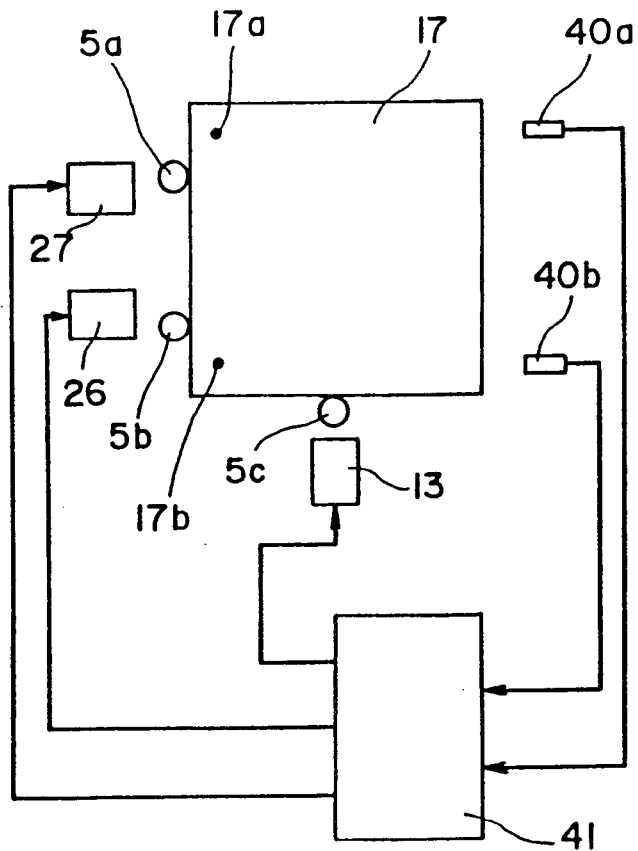
FIG. 11 is an explanatory view showing the control to be made by a control means over each driving device.
Figure 6:
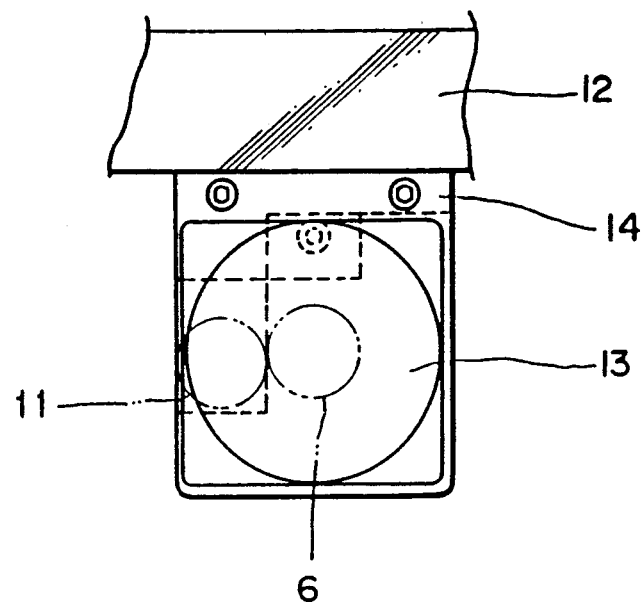
FIG. 6 is a front view showing the first driving device.

That is, a third supporting member 4c of a rectangular parallelopiped is mounted in the X-direction on one side of the base plate 2, and a first supporting member 4a extending in the Y-direction through a slide member 7 is connected with one end of the third supporting member 4c extending in the X-direction. The first supporting member 4a is mounted on the base plate 2 so that it slides with respect to the third supporting member 4c through the slide member 7 and is rotatable about the rotational shaft B. The slide member 7 is a slide device as shown in FIG. 5 or FIG. 9 which will be described later. The first supporting member 4a is slidable with respect to the third supporting member 4c through the slide member 7. The second supporting member 4b extending in the Y-direction is fixed to the other end of the third supporting member 4c extending in the X-direction, and a fourth supporting member 4d of a rectangular parallelopiped extending in the Y-direction is fixed to the side face of the second supporting member 4b. The first reference pin 5a is fixed to one end portion of the upper surface of the third supporting member 4c so that the first reference pin 5a aligns with the center axis of the first supporting member 4a extending in the Y-direction. The second reference pin 5b is fixed to the other end portion of the upper surface of the third supporting member 4c so that the second reference pin 5b aligns with the center axis of the second supporting member 4b extending in the Y-direction. An extension portion extending in the X-direction is formed on one end portion of the fourth supporting member 4d extending in the Y-direction, and the third reference pin 5c is fixed to the upper surface of the extension portion. In locating the workpiece 17 at the predetermined position, in order to allow each reference pin 5 and the workpiece 17 to move smoothly, each reference pin 5 comprises a resin-made cylindrical member 45 rotatable through a bearing 46 provided on the head of a threaded shaft to receive a nut. The position of the head of the threaded shaft can be adjusted by rotating the nut, and the lower portion of the threaded shaft is screwed down into each supporting member from the upper surface thereof. The first, second, and third reference pins 5a, 5b, and 5c each penetrate into the cut-away portions 12a, 12b, and 12c of the workpiece placing table 12, and the bolt head thereof projects upward from the upper surface of the workpiece placing table 12, thus being capable of contacting the end portion of the workpiece 17 placed on the workpiece placing table 12. According to the arrangement of each reference pin 5 as described above, the line passing through the first and second reference pins 5a and 5b and the line passing through the second and third reference pins 5b and 5c are perpendicular to each other. The first reference pin 5a and the second reference pin 5b can be dislocated from each center axis of the first supporting member 4a and the second supporting member 4b, respectively. The positions of each first, second, and third reference pin 5a, 5b, and 5c with respect to each supporting member can be respectively and independently adjusted providing that the above two lines are perpendicular to each other. That is, each interval between the reference pins can be adjusted according to the size of the workpiece 17.

The second and third driving devices for moving the reference pin supporting member 4 in the Y-direction and the $\theta$-direction are constructed as follows: That is, a pair of driving mechanisms serve as the second and third driving devices. One of the driving mechanisms moves the reference pin supporting member 4 in the Y-direction including the rotational shaft A of the reference pin supporting member 4 while the other driving mechanism moves the reference pin supporting member 4 in the Y-direction not including the rotational shaft A thereof. The entire reference pin supporting member 4 is moved forward or backward in the Y-direction by making the movement amounts of both driving mechanisms equal to each other, while the reference pin supporting member 4 is rotated in the $\theta$-direction by differentiating the movement amounts of both mechanisms from each other. Since both mechanisms have the same concrete structure, either of the two will be described below.

Figure 8:
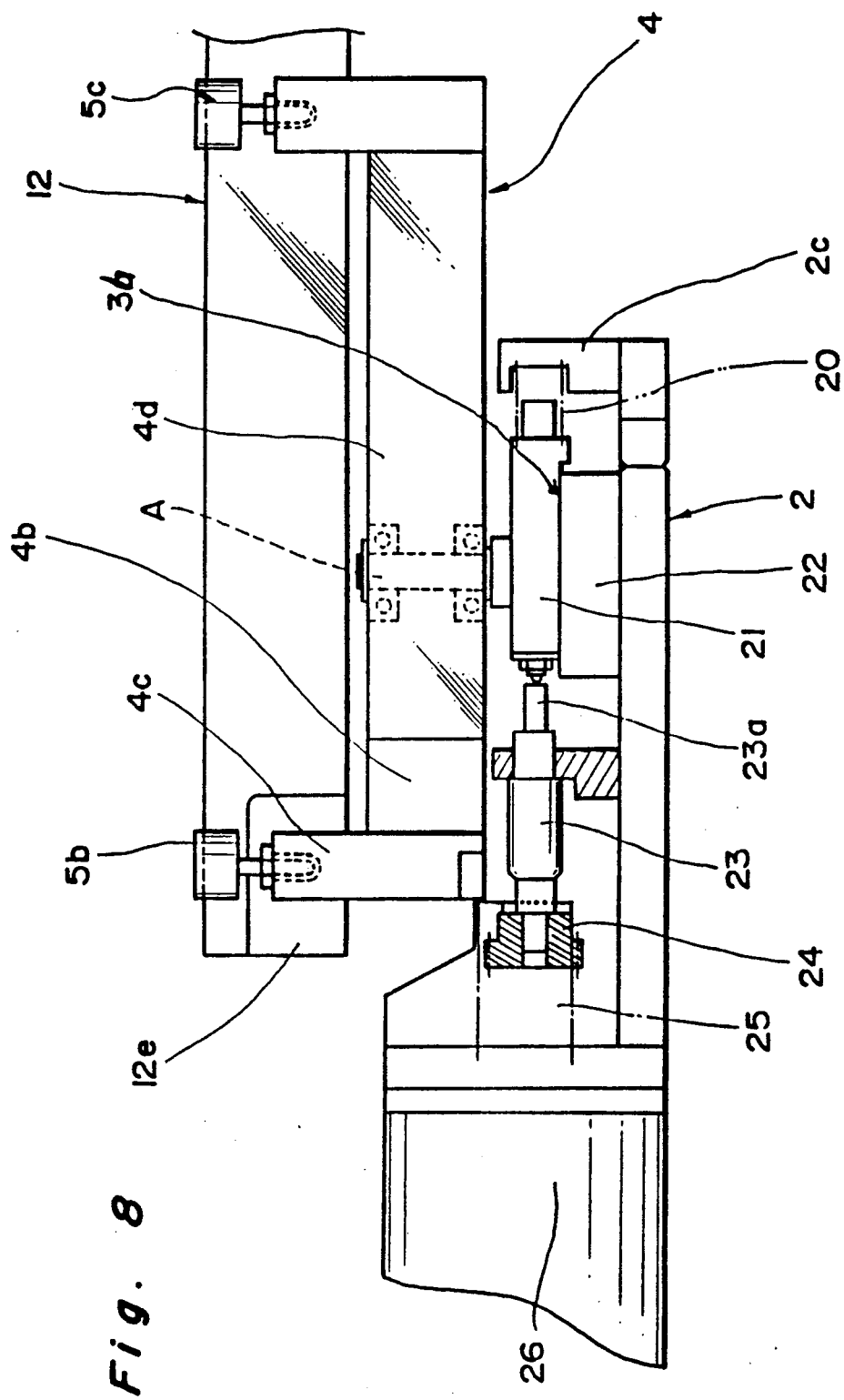
FIG. 8 is a front view showing second and third driving devices according to the above embodiment.

That is, as shown in FIG. 1, slide devices 3a and 3b are provided below the first and second supporting members 4a and 4b through rotational shaft supporting members 21 and 21, respectively. The rotational shaft supporting member 21 on the side of the first supporting member 4a supports the rotational shaft B of the first supporting member 4a, and the rotational shaft supporting member 21 on the side of the second supporting member 4b supports the above rotational shaft A, thereby moving the rotational shafts B and A in the Y-direction. Thus, the first and second supporting members 4a and 4b are moved in the same direction. As shown in FIGS. 2 and 8, a compression spring 20 is interposed between one end of the rotational shaft supporting member 21 and the locking end 2c of the base plate 2 so as to always press the rotational shaft supporting member 21 against the rotational shaft 23a of a micrometer head 23. The slide devices 3a and 3b each mounted on the lower surfaces of the rotational shaft supporting members 21 and 21 have the same structure and are known slide devices in which there are provided, between an upper portion 22 and a lower portion 28, two feeding portions comprising a ball 30 and a pair of rails 29 and 29 sandwiching the ball 30 therebetween as shown in FIG. 9. As shown in FIG. 8, the upper portion 22 is fixed to each of the first and second supporting members 4a and 4b through each of the rotational shaft supporting members 21 and the rotational shafts B and A, and the lower portion 28 is each fixed to the upper surface of the base plate 2. A first pulse motor 27 for the first supporting member 4a is mounted on the base plate 2 in the Y-direction, and a second pulse motor 26 for the second supporting member 4b is mounted thereon in the Y-direction. A gear 25 is fixed to the rotational shaft of each of the pulse motors 27 and 26, and a gear 24 engaging the gear 25 is fixed to the rotational shaft 23a of the micrometer head 23. With the rotation of the rotational shaft 23a, the rotational shaft 23a moves forward or backward along its axis, thus moving the rotational shaft supporting member 21 together with the upper portions 22 of the slide devices 3a and 3b with respect to the lower portion 28. As a result, each reference pin supporting member 4 is moved in the Y-direction.

Figure 10:
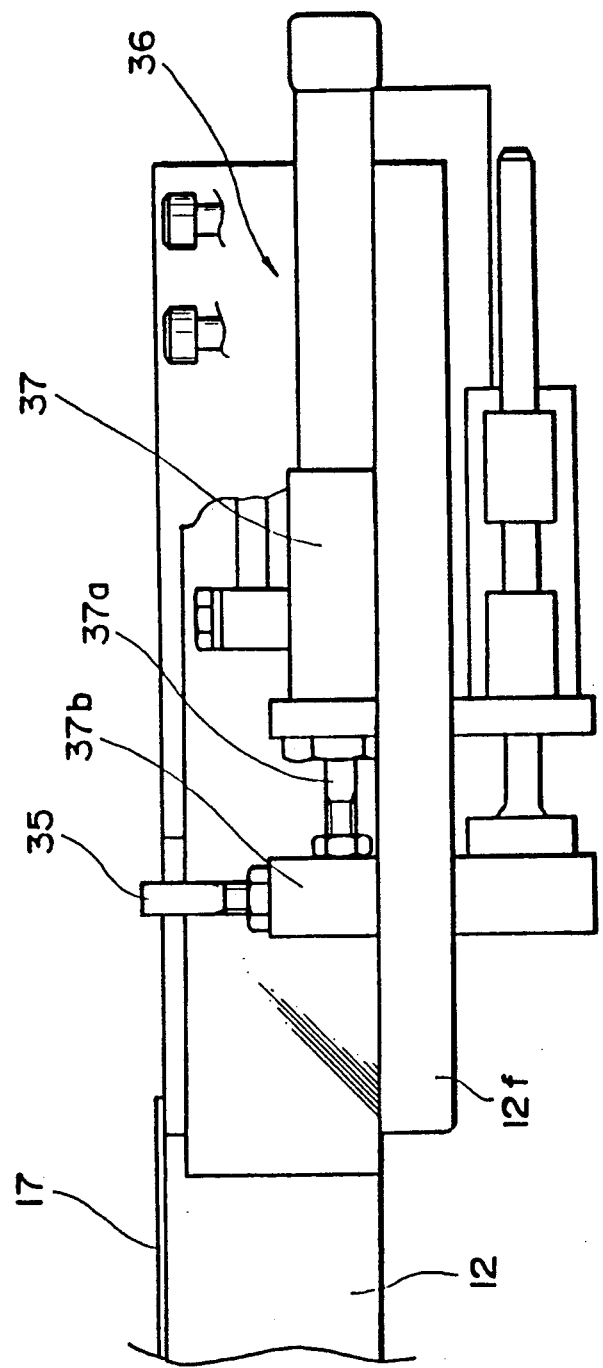
FIG. 10 is a front view showing a pressing device according to the above embodiment.

Each urging device urges the workpiece 17 so that it contacts each reference pin 5. As shown in FIG. 2, the first pusher pin 35a and the second pusher pin 35b are supported in the Y-direction in opposition to the first and second reference pins 5a and 5b, respectively on the workpiece placing table 12 so that the first and second pusher pins 35a and 35b are movable in the Y-direction, and the third pusher pin 35c is supported in the X-direction in opposition to the third reference pin 5c on the workpiece placing table 12 so that the third pusher pin 35c is movable in the X-direction. There is provided a third driving device 36 for moving each pusher pin 35 toward the side of each reference pin 35. As shown in FIG. 10, according to each driving device 36, an air cylinder 37 is supported by the workpiece placing table 12 at the lower surface thereof through a bracket 12f, and the workpiece 17 is placed on the workpiece placing table 12 with a supporting portion 37b which supports the pusher pin 35 fixed to the top end of the piston rod 37a of the air cylinder 37, then, each air cylinder 37 is driven to bring the pusher pin 35 in contact with the edge portion of the workpiece 17 so as to press the workpiece 17 against each reference pin 5. Thus, the workpiece 17 is held between the pusher pins 35 and the reference pins 5. Each reference pin 5 is not necessarily opposed to each pusher pin 35, but the pusher pin 35 can be positioned at an arbitrary position so as to perform the above-described operation. The air cylinder 37 of the third pusher pin 35c is not drawn in FIG. 2, but it has the same structure and function as the other air cylinders 37.

The positioning table is provided with television cameras 40a and 40b serving as the detecting means for detecting register marks 17a and 17b attached to the workpiece 17 and a microcomputer 41 serving as the calculating means both for calculating the dislocation amount between a result detected by the television cameras 40a and 40b and the desired position of the workpiece 17 and controlling the drive of each motor 13, 26, and 27. If a glass plate is used as the workpiece 17, the marks 17a and 17b are printed thereon.

In the above structure, the workpiece 17 is placed on the workpiece placing table 12, the air cylinders 37, 37, and 37 are driven to bring the pusher pins 35a, 35b, and 35c in contact with the workpiece 17 so that the workpiece 17 can be reliably contact the first, second, and third reference pins 5a, 5b, and 5c. Then, the positions of register marks 17a and 17b of the workpiece 17 are detected by the television cameras 40a and 40b, respectively, so that the current position of the workpiece 17 is detected. Then, the detected data is inputted to the microcomputer 41. The microcomputer 41 calculates the dislocation amount between the current position of the workpiece 17 and the desired position thereof, then outputs an instruction signal to each motor 13, 27, and 26 so as to compensate the dislocation amount in the X-direction, the Y-direction, and the $\theta$-direction while controlling each motor 13, 27, and 26. That is, first, in order to adjust the position of the workpiece 17 in the $\theta$-direction, the first pulse motor 27 and the second pulse motor 26 are driven in a different amount so as to forward or backward in the Y-direction by the guide of the first and second slide devices 3a and 3b through the micrometer heads 23 and 23, the rotational shaft supporting members 21 and 21, and the rotational shafts B and A, then rotate the reference pin supporting member 4 a predetermined angle corresponding to the dislocation amount about the rotational shaft A. The second through fourth supporting members 4b, 4c, 4d and the slide member 7 are fixed to each other, so that they move together in the Y-direction with the movement of the second supporting member 4b, namely, with the movements of the rotational shaft A and the supporting member 21 thereof and then rotate together in the $\theta$-direction of the rotational shaft A owing to the movement of the first supporting member 4a in the Y-direction due to the actuation of the second pulse motor 26. On the other hand, the first supporting member 4a moves in the Y-direction together with the rotational shaft B and the rotational shaft supporting member 21 thereof due to the actuation of the first pulse motor 27 while the first supporting member 4a slides with respect to the slide member 7 and the third supporting member 4c and rotates about the rotational shaft B due to the rotation of the second supporting member 4b about the rotational shaft A. Owing to the slide of the first supporting member 4a with respect to the slide member 7, the connection of the first supporting member 4a and the other supporting members 4b, 4c, and 4d can be maintained smoothly. As a result of the movement of the first and second supporting members 4a and 4b in the Y-direction in a different amount, the workpiece 17 is rotated in the $\theta$-direction. Thus, the position adjustment of the workpiece 17 in the $\theta$-direction is accomplished. Thereafter, the driving motor 13 is actuated by a predetermined amount to move the entire base plate 2 forward or backward in the X-direction. Thus, the position of the workpiece 17 in the X-direction is adjusted. Then, the first pulse motor 27 and the second pulse motor 26 are driven in the same amount so as to move the workpiece 17 forward or backward in the Y-direction in the same amount together with the rotational shafts B and A, namely, the reference pin supporting member 4. Thus, the position of the workpiece 17 is adjusted in the Y-direction. When the marks 17a and 17b of the workpiece 17 are at the desired position, respectively, the positioning operation terminates. When the workpiece 17 is not at the desired position, a required motor is driven to adjust the position of the workpiece 17. Since the workpiece 17 is pressed against the reference pins 5 by the air cylinders 37, 37, and 37, the workpiece 17 follows the movement of the reference pins 5.

According to the above embodiment, the three reference pins 5a, 5b, and 5c are supported by the reference pin supporting member 4 and move together in the $\theta$-direction about the rotational shaft A. Therefore, the three reference pins 5a, 5b, and 5c move together with the reference pin supporting member 4 in each direction when each reference pin 5 is moved in the X-direction or the Y-direction. When the workpiece 17 is moved in the $\theta$-direction, the rotational center of the workpiece 17 is fixed because the workpiece 17 reliably rotates about the predetermined rotational shaft A. Therefore, the period of time for locating the workpiece 17 at a predetermined position based on data can be shortened. Since the apparatus comprises two-layered construction of the workpiece placing table 12 and the base plate 2, the apparatus is compact, light, and simple in construction. There are very few driving devices such as reference pins in the right side of FIG. 2. Therefore, the space in this portion can be effectively utilized.

The present invention is not limited to the above embodiment, but various changes and modifications are possible. For example, the operation for adjusting the position of the workpiece 17 is not necessarily started from the operation for the position adjustment in the $\theta$-direction, but can be started from the operation for the position adjustment in the X-direction, the Y-direction or simultaneously in the X-direction, the Y-direction, and the $\theta$-direction. The functions of the second and third driving devices are performed by the pair of driving devices, but each can be performed by a separate device. That is, for example, the second driving device can comprise a driving mechanism for moving the rotational shaft A in the Y-direction and the third driving device can comprise a driving mechanism for directly rotating the rotational shaft A or a driving mechanism for moving the reference pin supporting member 4 in the Y-direction not including the rotational shaft A. The motor which is a part of each driving device is not limited to the pulse motor, but other types of motors such as a servo motor can be used. The driving device is not limited to a motor, but a known driving member can be used. A ball thread can be used instead of the micrometer head.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A workpiece positioning table comprising:
   a fixed workpiece placing table (12) for placing a workpiece (17);
   a base plate (2) supported below the workpiece placing table (12) so that the base plate (2) is movable in X-direction relative to the workpiece placing table (12);
   a first driving device (13, 10, 15) for moving the base plate (2) in the X-direction;
   a first reference member (5a), a second reference member (5b), and a third reference member (5c) each capable of contacting the workpiece (17) placed on the workpiece placing table (12);
   a reference member supporting member (4), mounted on the base plate (2) for movement therewith and so that the reference member supporting member (4) is respectively movable in Y-direction and $\theta$-direction about a predetermined shaft (A) relative to the baseplate (2) and the workpiece placing table (12), for supporting the first reference member (5a) and the second reference member (5b) spaced a predetermined interval from each other and the third reference member (5c), spaced a predetermined interval from the second reference member (5b), in a direction perpendicular to a direction in which the first reference member (5a) and the second reference member (5b) are arranged;
   a second driving device (26, 27, 23, 20) for moving the reference member supporting member (4) in the Y-direction;
   a third driving device (26, 27, 23, 20) for moving the reference member supporting member (4) in the $\theta$-direction;
   an urging device for urging the workpiece (17) so that the workpiece (17) contacts the first reference member (5a), the second reference member (5b), and the third reference member (5c);
   a mark detecting means (40a, 40b) for detecting position adjusting marks (17a, 17b) attached to the workpiece (17);
   a calculating means (41) for calculating a dislocation amount between a result detected by the detecting means (40a, 40b) and a desired position at which the marks (17a, 17b) are to be positioned; and
   a control means (41) for, based on a result calculated by the calculating means (41), controlling movements of the first driving device (13, 10, 15), the second driving device (26, 27, 23, 20), and the third driving device (26, 27, 23, 20) so as to place the marks (17a, 17b) at the desired position.

2. The positioning table as claimed in claim 1, wherein the second driving device (26, 27, 23, 20) and the third driving device (26, 27, 23, 20) comprises a pair of driving mechanisms for moving the reference member supporting member (4) in the Y-direction, and the reference member supporting member (4) is moved in the Y-direction by making movement amounts of both driving mechanisms equal to each other and rotated in the $\theta$-direction about the predetermined shaft (A) by differentiating the movement amounts of both mechanisms from each other.

3. The positioning table as claimed in claim 1, wherein movement of each of the reference members is adjustable with respect to the reference member supporting member (4).

* * * * *